United States Patent [19]

Park et al.

[11] 4,004,342
[45] Jan. 25, 1977

[54] FABRICATION OF ION IMPLANTED P-N JUNCTION DEVICES

[75] Inventors: Yoon Soo Park, Kettering; Phil Won Yu, Dayton, both of Ohio

[73] Assignee: The United States of America as represented by the Secretary of the Air Force, Washington, D.C.

[22] Filed: Feb. 23, 1976

[21] Appl. No.: 660,521

[52] U.S. Cl. .................................. 29/590; 148/1.5; 357/61; 357/63; 357/91
[51] Int. Cl.² .......................................... B01J 17/00
[58] Field of Search ................. 29/576 B, 589, 590; 148/1.5; 357/61, 63, 11, 17, 91

[56] References Cited

UNITED STATES PATENTS

| 3,767,471 | 10/1973 | Kasper | 148/1.5 |
| 3,940,847 | 3/1976 | Park | 29/590 |

OTHER PUBLICATIONS

Journal of the Electrochemical Society, vol. 103, No. 11, pp. 609 and 610, Austin et al., "New Semiconductors with the Chalcopyrite Structure."

Primary Examiner—W. Tupman
Attorney, Agent, or Firm—Joseph E. Rusz

[57] ABSTRACT

Light emitters and photovoltaic detectors are fabricated by ion implantation of cadmium, zinc, bromine or chlorine ions into a p-type $CuInSe_2$ substrate so as to form a p-n semiconductor junction.

5 Claims, 14 Drawing Figures

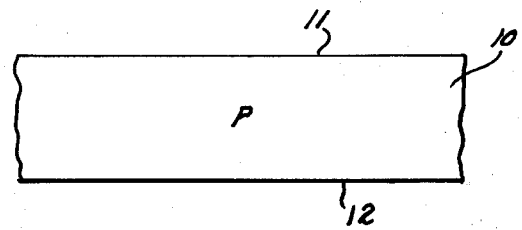
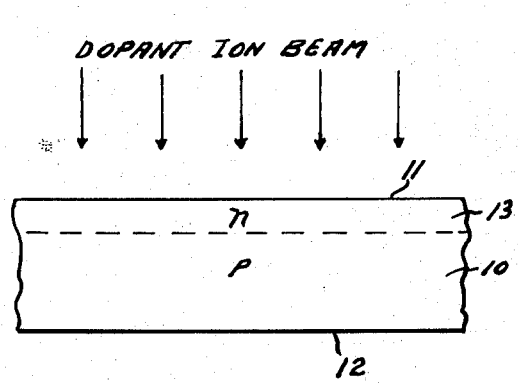
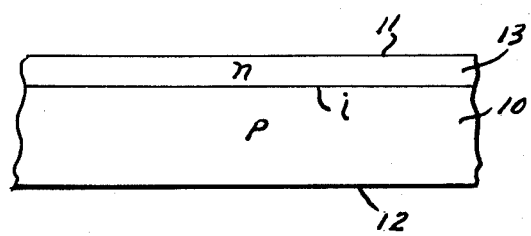
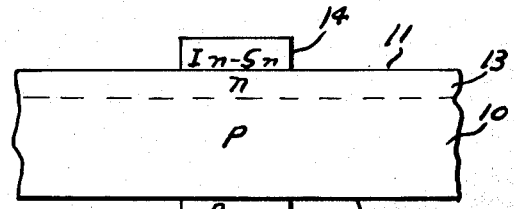
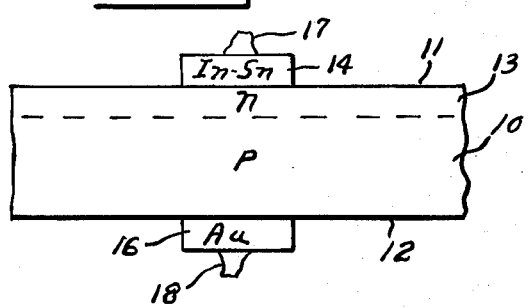

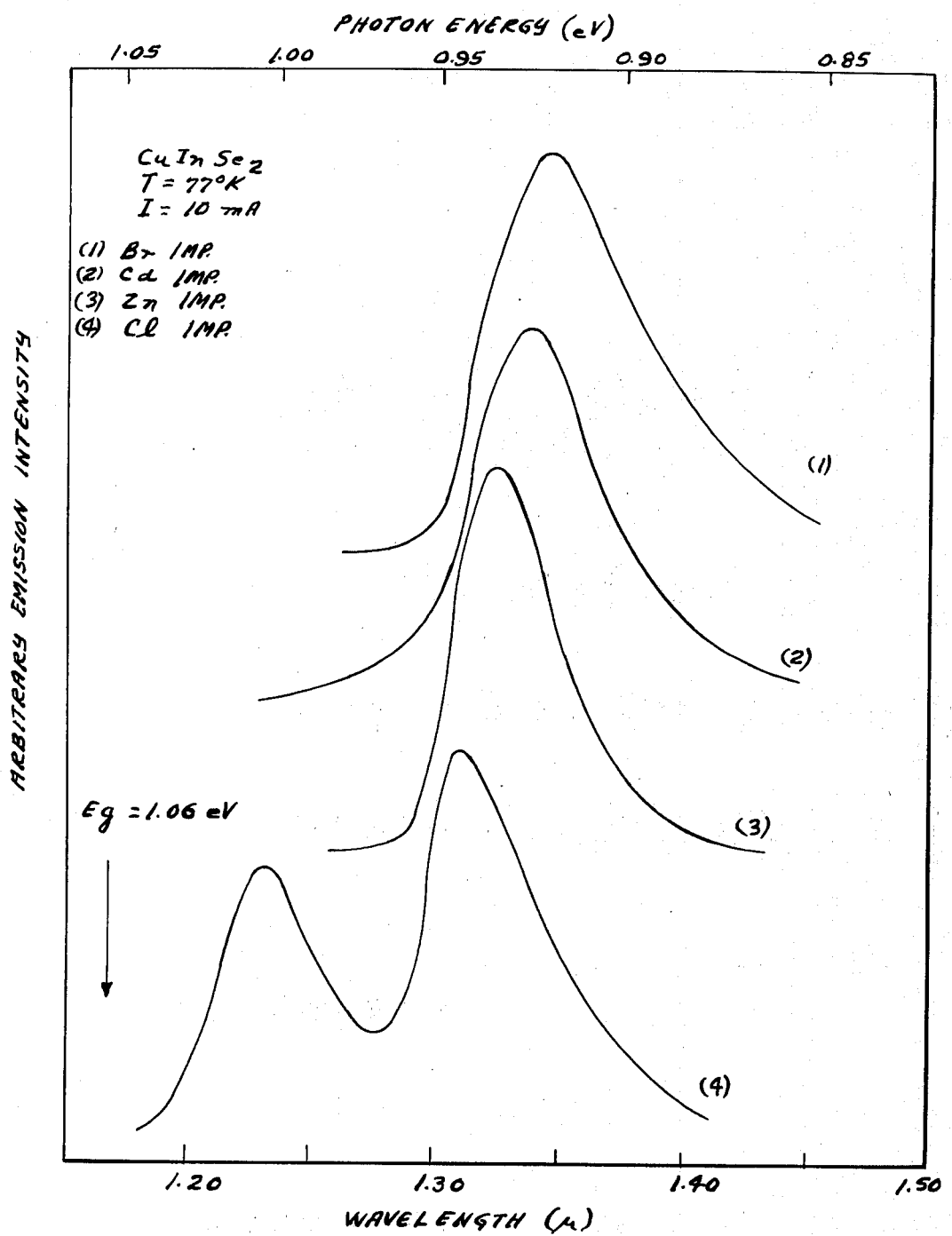

FABRICATION OF ION IMPLANTED P-N JUNCTION DEVICES

RIGHTS OF THE GOVERNMENT

The invention described herein may be manufactured and used by or for the Government of the United States for all governmental purposes without the payment of any royalty.

FIELD OF THE INVENTION

This invention relates to a method of fabricating p-n and p-i-n junction devices by ion implantation. In one aspect it relates to a method of fabricating p-n and p-i-n junction diodes by the ion implantation of Cd, Zn, Br or Cl into p-type $CuInSe_2$ crystals.

BACKGROUND OF THE INVENTION $CuInSe_2$ is a member of the I-III-$VI_2$ class of chalcopyrite compounds (Groups I, III and VI of Mendelyeev's Periodic Table). B. Tell et al. in Journal of Applied Physics 43, 2469 (1972) disclose that $CuInSe_2$ crystals having p- and n-type conductivity can be obtained by heat treatment under maximum and minimum Se atmosphere. P. Migliorato et al. in Applied Physics Letters 24, 434 (1974) describe the fabrication of a homojunction electroluminescent device by diffusing Se into n-type $CuInSe_2$ crystals. S. Wagner et al. in Applied Physics Letters 25, 434 (1974) describe the fabrication of a $CuInSe_2$/CdS p-n heterojunction photovoltaic detector.

The technique of forming p-n junctions by ion implantation has been known for a number of years. In general, the techniques has been investigated with respect to p-n junction formation in common semiconductor materials, such as silicon, germanium, gallium arsenide, gallium antimonide, indium arsenide, and the like. While the diffusion method, as mentioned above, has been employed to create a p-n junction in $CuInSe_2$, it would be particularly desirable to provide an ion implantation method for forming the junction. This is the case since several advantages accrue from the utilization of the ion implantation method as compared to the diffusion method. Thus, ion implantation makes it possible to achieve uniform and controlled doping as well as controlled junction depth and profile. Furthermore, the low temperature processing involved in the ion implantation method is a definite advantage over the high temperature requirements of the diffusion method.

It is an object of this invention to provide an ion implantation method for preparing p-n junctions in p-type $CuInSe_2$ crystals.

Another object of the invention is to provide a method for fabricating p-n junction light emitters and photovoltaic detectors by the ion implantation of certain dopants into p-type $CuInSe_2$ crystals.

A further object of the invention is to provide a method for fabricating diodes having a p-i-n structure.

Other objects and advantages of the invention will become apparent to those skilled in the art upon consideration of the accompanying disclosure and the drawing, in which:

FIG. 1 is a schematic representation of a p-type $CuInSe_2$ wafer;

FIG. 2 illustrates schematically the ion beam which produces the n-doped region;

FIG. 3 illustrates schematically a p-type $CuInSe_2$ having an insulating (i) layer and an n-doped region, thereby providing a p-i-n structure;

FIG. 4 illustrates schematically the contacts formed on the p-n junction $CuInSe_2$ wafer;

FIG. 5 illustrates schematically the electrical connections to the contacts;

FIG. 13 shows the electroluminescence spectra obtained from p-n junctions prepared by implanting Br, Cl, Zn and Cd.

SUMMARY OF THE INVENTION

Figure 6A:
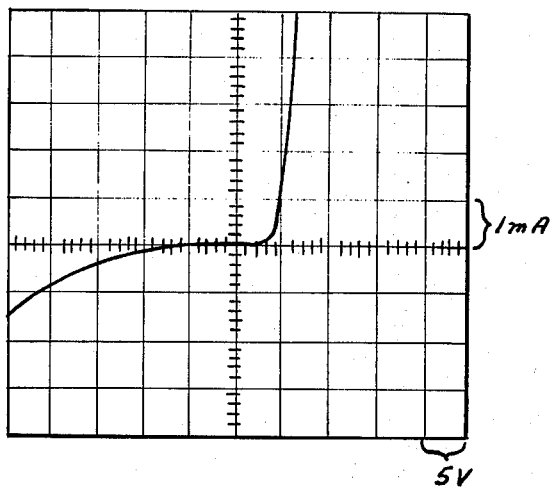
FIGS. 6a and 6b show the curve-tracer display of the current-voltage characteristics of two diodes fabricated according to the present invention.

The present invention resides in a method for forming p-n and p-i-n junctions in p-type $CuInSe_2$ crystals to provide light emitters and photovoltaic detectors. Broadly speaking, the method comprises the steps of bombarding a plane surface of a p-type $CuInSe_2$ crystal with cadmium, zinc, bromine or chlorine ions so as to form an n-type region adjacent the surface; and annealing the crystal under conditions such as to provide a p-n junction or a p-i-n junction.

The single crystals of $CuInSe_2$ used as the semiconductor substrates in the method of this invention are melt grown. Mixtures of Cu, In and Se (99.9999% purity) are reacted by heating at 1050° C in an evacuated quartz tube. A slight excess of Se is added to maintain an excess pressure on the sample, the purpose being to obtain p-type crystals and reduce the formation of voids. Typical as-grown crystals have a room temperature mobility of about 9 $cm^2$/V·sec and hole concentration ranging from $2 \times 10^{16}$ to $7 \times 10^{16}$ $cm^{-3}$. Crystals having flat, as-grown (112) faces or surfaces are employed as substrates.

For a more comprehensive understanding of the invention, reference is now made to the drawing in which identical reference numerals are used in the figures to designate the same or similar elements. In FIG. 1 there is shown a p-type $CuInSe_2$ crystal substrate 10. The substrate has a first (112) plane surface 11 and a second (112) plane surface 12 opposite the first surface. Prior to ion implantation, each of the crystal plane surfaces are mechanically polished. Also, the surface to be implanted is chemically etched with a hot solution containing equal parts by weight of hydrochloric acid and nitric acid. Contact of the surface for about 0.5 to 1.5 minutes with the solution at a temperature ranging from about 70° to 90° C has been found to accomplish the desired etching. Upon completion of the etching, the surface is washed with a boiling caustic solution, e.g., a solution containing 25 percent by weight of sodium hydroxide, for a period of 15 to 30 seconds. The surface is then rinsed successively with boiling trichloroethylene, acetone, boiling methanol, and deionized water.

As illustrated in FIG. 2, surface 11 of crystal substrate 10 is bombarded with a beam of cadmium, zinc, bromine or chlorine ions. As a result of this ion bombardment, n-type region or layer 13 is formed adjacent surface 11. The technique of ion implantation is well known and is amply described in literature. Also, ion implantation apparatus is available from commercial sources.

In the present method, ion implantation is performed at about room temperature at an energy of 135 keV to a dose level ranging from about $10^{14}$ to $10^{16}$ per square centimeter. After implantation the device is annealed under a vacuum, e.g., $10^{-6}$ torr, at a temperature ranging from 300° to 500° C for a period of 10 to 30 minutes. As a result of the annealing, any lattice damage caused by the ion bombardment is reduced. Furthermore, annealing permits the ion dopants to act as donors by substituting for Cu and Se on the lattice sites in $CuInSe_2$. The temperature at which annealing is conducted is determinative of whether a p-n junction device or a p-i-n junction device is formed. When the annealing temperature is in the upper end of the 300° to 500° C range, e.g., from about 350° to 500° C, a p-n junction device is formed as shown in FIG. 2. However, annealing carried out in the lower end of the 300° to 500° C range, e.g., from about 300° to 350° C, produces a p-i-n junction device as shown in FIG. 3. It is often preferred to anneal at about 400° C when forming p-n junctions and at about 340° C when forming p-i-n jucntions. In any event it is critical that the annealing step be conducted at a temperature in the range of 300° to 500° C in fabricating the diodes of this invention.

Upon completion of the annealing, contacts are deposited by conventional sputtering of an indium-tin alloy 14 on surface 11 and gold 16 on surface 12. Before forming ohmic contact 16, the substrate is etched as described hereinabove while protecting implanted area 13 with wax. It is to be understood that surfaces 11 and 12 can both be etched in the same operation prior to implantation, thereby making it unnecessary to perform a separate etching of the substrate. As depicted in FIG. 5, electrical lead wires 17 and 18 are soldered to contacts 14 and 16 so as to provide electrical connections. In fabricating a p-i-n device, the same procedure is followed in making the contacts and electrical connections.

A more complete understanding of the invention can be obtained by referring to the following illustrative examples which are not intended, however, to be unduly limitative of the invention.

EXAMPLE I

Two experiments were conducted in which two diodes were prepared by implanting cadmium ions in samples of p-type $CuInSe_2$ crystals following the procedure described hereinabove. An 150 keV ion accelerator manufactured by Accelerators, Inc., was used in these and succeeding experiments. In the case of each diode, implantation was performed at room temperature at an energy of 135 keV with a dose of $10^{15}$ cm$^{-2}$. Both implanted samples were annealed for 30 minutes, one at 400° C and the other at 340° C.

Figure 6B:
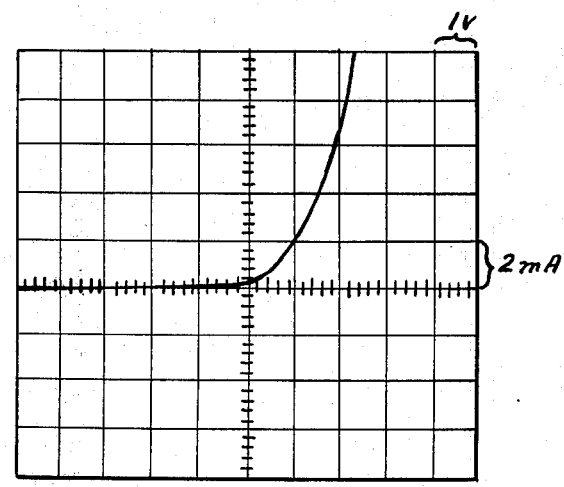

The current-voltage characteristics of the diode annealed at 400° C and the diode annealed at 340° C are shown, respectively, in FIGS. 6a and 6b.

The most significant difference between the two diodes is that the 340° C annealed diode, as shown in FIG. 6b, has a larger reverse breakdown voltage (~30V). The forward characteristics also show a higher series resistance (~400Ω). The reverse-bias capacitance measured at 1 MHz was nearly independent of applied voltage up to 10V. The magnitude of the capacitance indicates an intrinsic region of ~10μ. Thus, the 340° C annealed diode, whose current-voltage characteristics are shown in FIG. 6b, has a p-i-n junction.

The diode annealed at 400° C, whose current-voltage characteristics are shown in FIG. 6a, is the type most commonly prepared. The forward current-voltage characteristics of this diode can be expressed by $I = I_o[\exp(eV/nkT)-1]$ over a considerable range at room temperature. The parameter n was found to lie between 1.7 and 2.0 for the junctions of several diodes prepared in the same manner as the 400° C annealed diode described in this example. This indicates the formation of a p-n junction and also connotes that the current is due to thermally activated injection over the junction barrier with recombination in the space-charge region via deep levels. At higher bias the current was limited by a series resistance of ~15Ω for voltages above 0.8V. For forward and reverse voltages of 1V, the rectification ratio was about 2 × 10$^4$:1. Reverse-bias capacitance measured at 1 MHz exhibited a linear $C^{-3}$ vs V relation in the reverse-bias range of 0–6V, which is characteristic of a linearly graded junction.

Using the LSS theory without channeling, the projected range of Cd in $CuInSe_2$ at 135 keV is estimated to be about 400A with a straggling range of about 200A. However, the diffusion rate of Cd is rapid in $CuInSe_2$, which explains the smoothing out of the as-implanted profile by thermal diffusion during the annealing period and the resulting graded junction.

EXAMPLE II

Hall measurements were made on a cadmium implanted p-type $CuInSe_2$ crystal prepared according to the procedure described hereinabove. Implantation was performed at room temperature at an energy of 135 keV with a dose of $10^{15}$ cm$^{-2}$. The implanted crystal was annealed at 370° C for 30 minutes. The implanted layer had a room temperature sheet resistivity of 2.8 × $10^3$ ohms per square, an electron concentration of 3.9 × $10^{13}$ cm$^{-2}$, and mobility of 57 cm$^2$/Vsec. A strong n-type signal was also observed by a thermal probe measurement.

EXAMPLE III

Figure 7:
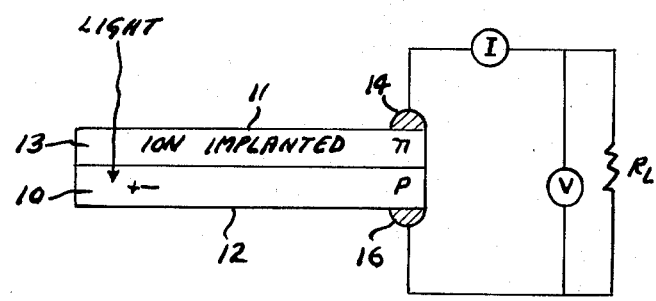
FIG. 7 is a schematic representation of a photovoltaic detector.
Figure 8:
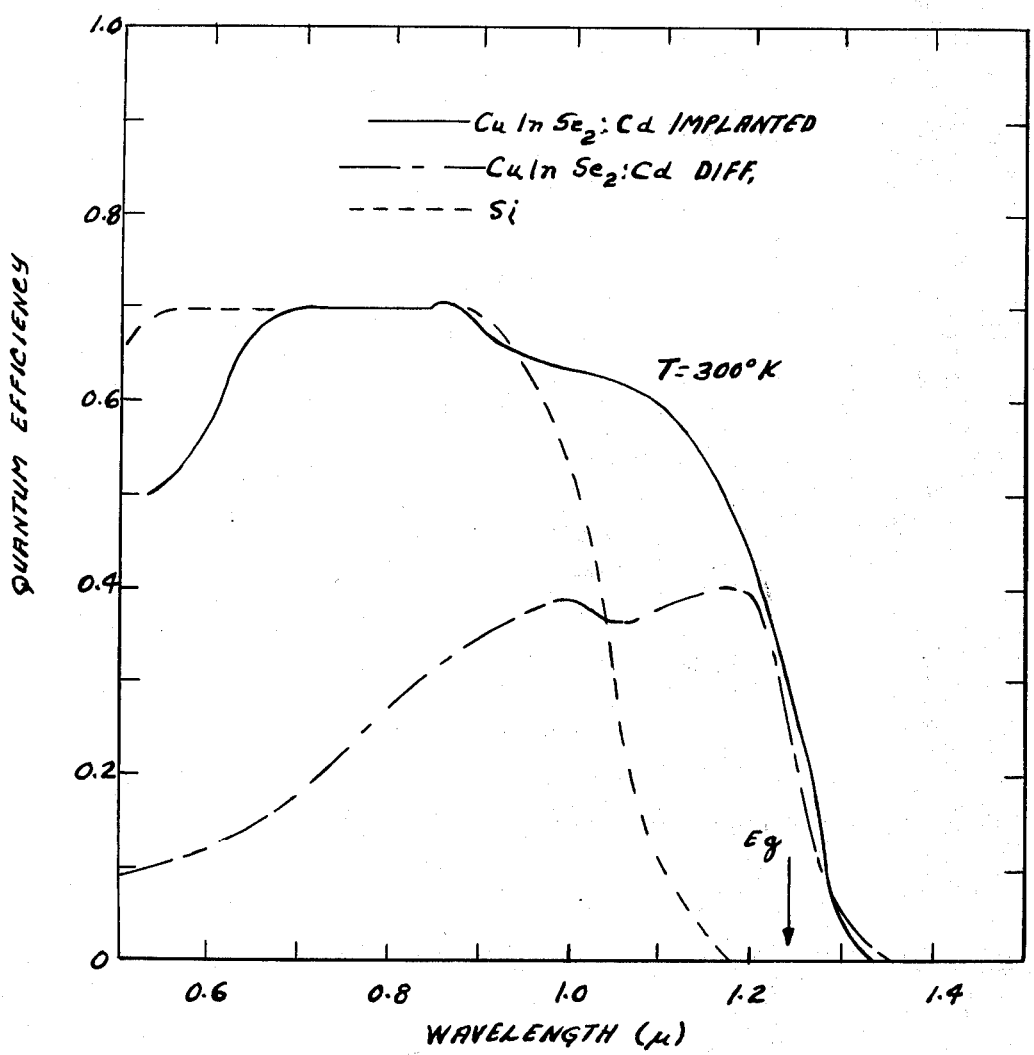
FIG. 8 is a graph showing the spectral dependence of the photovoltaic quantum efficiency for Cd implanted $CuInSe_2$, Cd diffused $CuInS_2$, and Si junctions.

Diodes fabricated as described in Example I provided an efficient photovoltaic detector as depicted schematically in FIG. 7. The implanted layer 13 had a negative voltage with respect to substrate 10. The absolute photovoltaic quantum efficiency of the devices for light incident upon the n-layer was measured for both types of junctions illustrated in FIGS. 6a and 6b. As shown in FIG. 8, the efficiency is relatively uniform at 60 to 70 percent for the wavelength between 0.7 to 1.1μ. The efficiency at wavelengths shorter than 0.7μ appeared to be influenced by the surface states of the implanted layers. The efficiency shown was obtained for diodes having a reverse-bias voltage ≥3V.

Also as shown in FIG. 8, the efficiency of the Cd implanted CuInSe$_2$ junctions is better than that of the Cd diffused CuInSe$_2$ junctions. Furthermore, the response is extended to 1.3$\mu$, which cannot be obtained with silicon.

EXAMPLE IV

Figure 9:
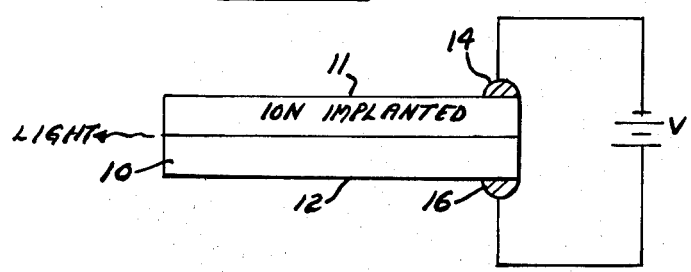
FIG. 9 is a schematic representation of a light emitter.
Figure 10:
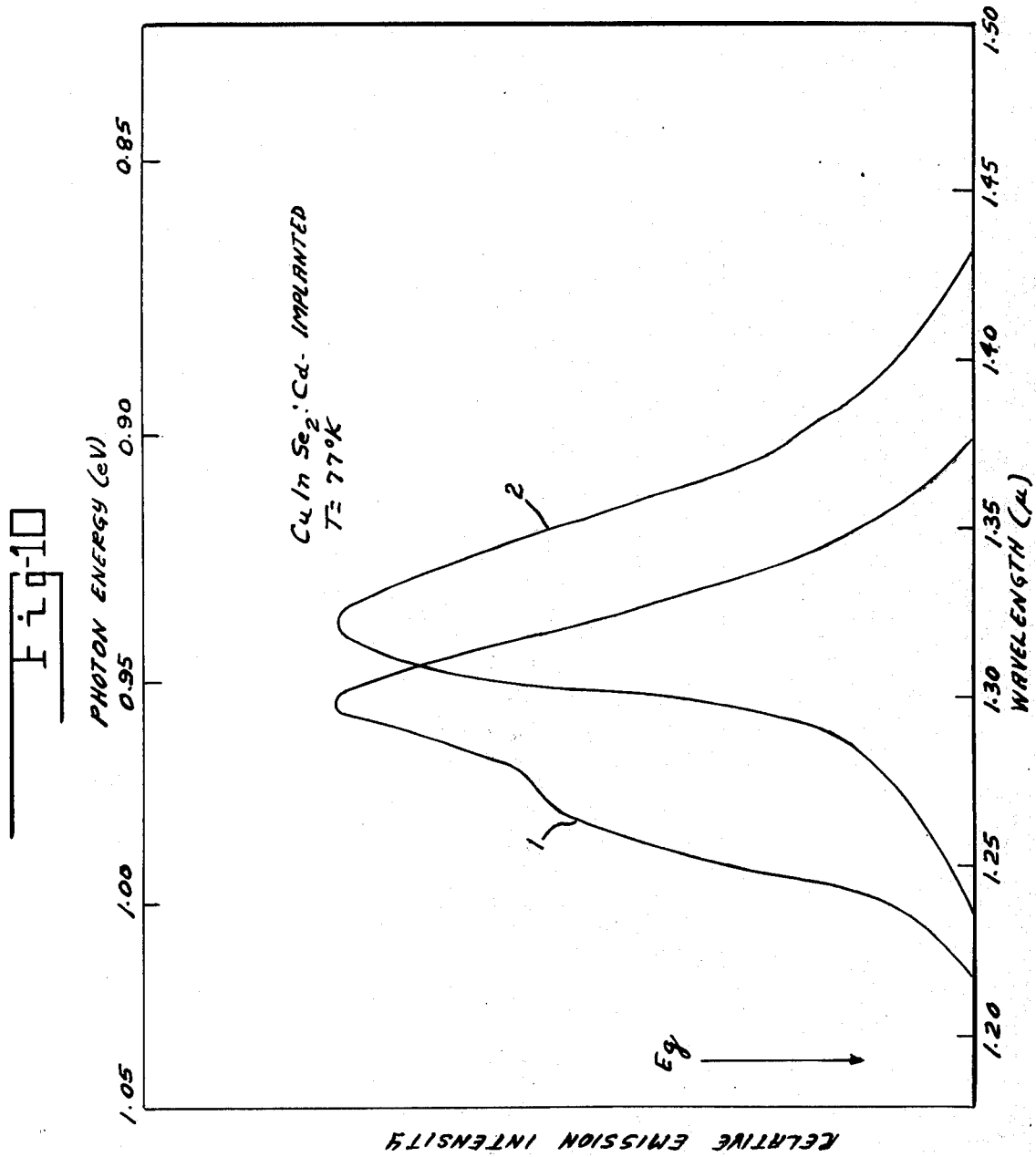
FIG. 10 shows the electroluminescence spectra of two Cd implanted $CuInSe_2$ diodes.

Diodes fabricated as described in Example I, which had a p-n junction as shown in FIG. 6a, provided efficient light emitters as depicted schematically in FIG. 9. Efficient electroluminescence was obtained at 77° K for the forward current of the p-n junction. The spectra obtained from several diodes peak at wavelengths in the range of 1.27 to 1.34$\mu$ with a current of 10 mA. The origin of the radiative recombination appears to be due to donor-acceptor pair recombination. However, the spectra have the following property: the energy of the peak position is either independent of the diode current or increase with increasing current, depending upon the samples. Typical spectra are shown in FIG. 10 for both types of radiation. The spectra were obtained using a room temperature PbS detector and collecting the light from the n-side. The peak energy of spectrum 1 is independent of the current while that of spectrum 2 increases with increasing current.

Figure 11:
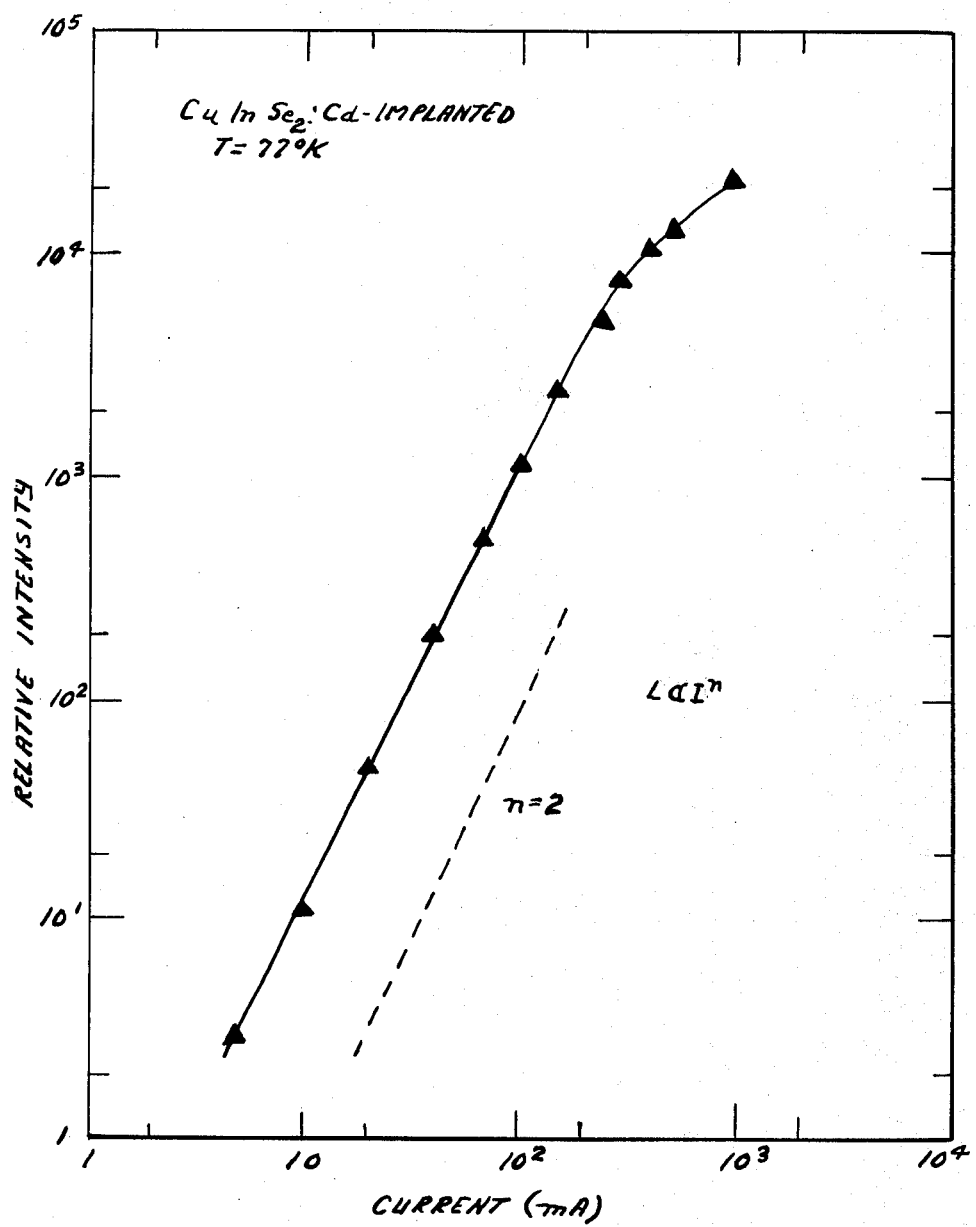
FIG. 11 is a graph showing the dependence of relative electroluminescence intensity upon the forward current.

As shown in FIG. 11, the relative light intensity from a p-n junction was plotted in double logarithmic scale as a function of the forward current. The intensity (L) as a function of the current characteristics can be described by the relation L $\propto$ I$^n$, with n=2 in the observed range. This indicates that the current is mainly due to the recombination of the injected carriers in the space-charge region. This relation was observed for both spectra shown in FIG. 10. The dotted line indicates the relation L $\propto$ I$^n$ when n=2.

EXAMPLE V

A series of experiments was conducted in which p-n junctions were prepared by implanting zinc, bromine and chlorine in p-type CuInSe$_2$ crystals. The ion implantations were performed at room temperature at an energy of 135 keV to a dose level of 10$^{14}$ to 10$^{16}$ cm$^{-2}$. The p-type crystals used as substrates have flat, as-grown (112) faces which were pretreated by polishing and etching as described hereinbefore. The room temperature hole concentration of the substrates ranged from 2 $\times$ 10$^{16}$ to 7 $\times$ 10$^{16}$ cm$^{-3}$, with the mobility being ~9 cm$^2$/V$\cdot$sec. Annealing was carried out under a vacuum at 400° C for 30 minutes in order to reduce lattice damage caused by the bombardment and to allow Zn, Br and Cl to substitute for Cu and Se.

Figure 12:
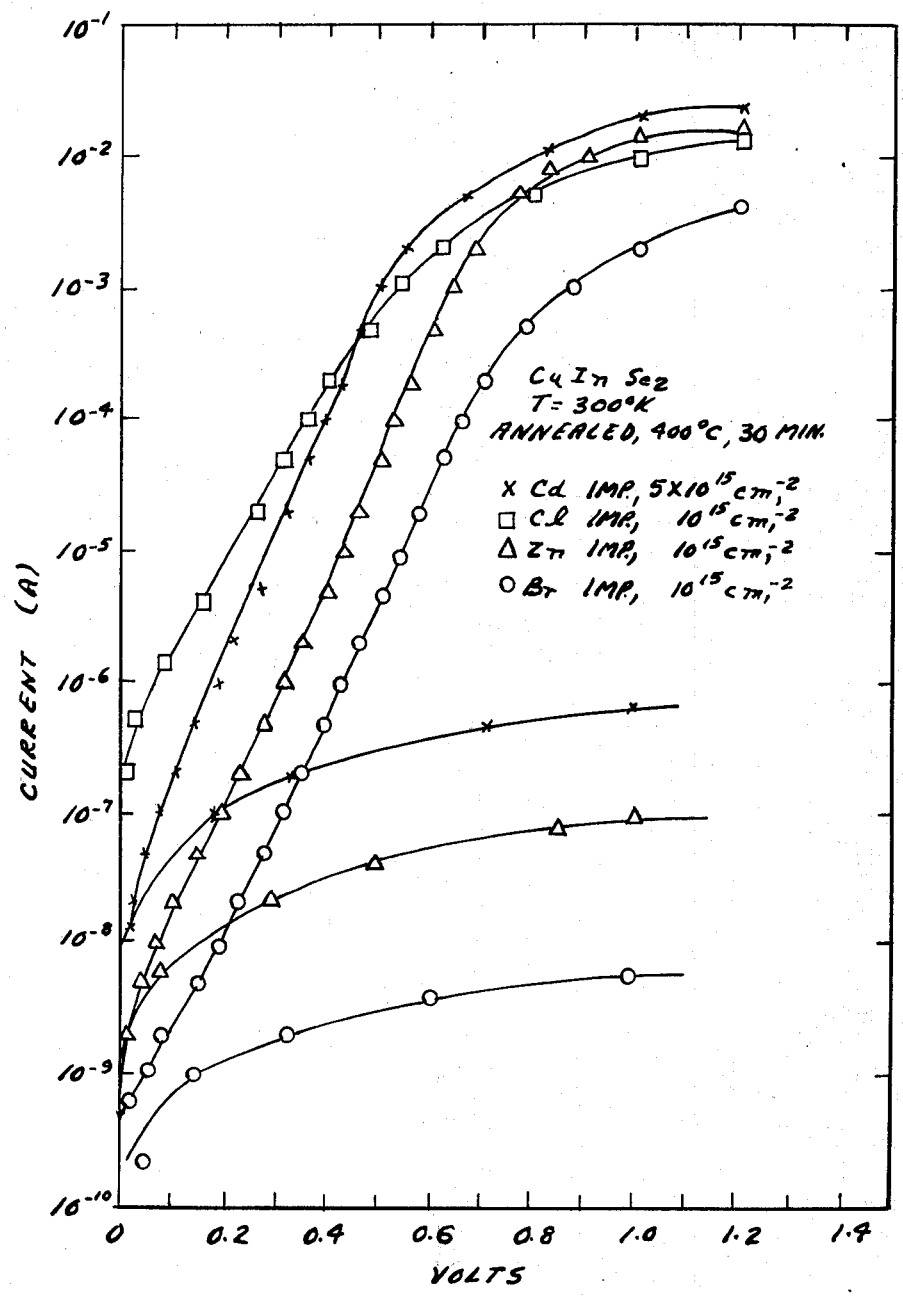
FIG. 12 is a graph showing the room temperature current-voltage characteristics of the p-n junctions prepared by implanting Br, Cl, Zn and Cd.

The current-voltage characteristics of p-n junctions prepared by implanting Zn, Br and Cl are shown in FIG. 12 together with those of a p-n junction prepared by Cd implantation. The forward current-voltage characteristics of these diodes can be expressed by I=I$_o$[exp (eV/nkT)−1] over a considerable range at room temperature. The parameter n is 1.9 for the junction prepared with Br and Zn and 2.3 for the junction prepared with Cl. This indicates the formation of p-n junctions. The parameter n≅2 shows that the dominant recombination takes place in the space-charge region via deep levels. The rectification ratio at 1V is 3 $\times$ 10$^5$:1, 2 $\times$ 10$^5$:1, and 8 $\times$ 10$^3$:1 for p-n junctions prepared by implanting Br, Zn and Cl, respectively, as shown in FIG. 12. The series resistances limiting the current flow under forward bias of greater than ~0.8V are generally ~16$\Omega$. The reverse breakdown voltages were observed to be 4–7V. Reverse bias capacitance measure at 1 MHz exhibited C$^{-3}$ vs V relation in the reverse bias range of 0–7V, which is characteristic of a linearly graded junction.

EXAMPLE VI

Experiments were carried out in which Hall measurements were made on Zn implanted layers. In order to confine the current to the implanted layers, diodes having p-i-n junctions were made. Implantation was performed at an energy of 135 keV to a dose level of 1 $\times$ 10$^{16}$ cm$^{-2}$. Annealing was carried out under a vacuum at 350° C for 30 minutes. The junction capacitance at 1 MHz was measured at room temperature. The reverse-bias capacitance is nearly independent of voltage up to 10V. The forward current-voltage relation showed a region approximated by I$\alpha$V$^3$. The magnitude of the capacitance indicates an insulating layer of ~30$\mu$. For a typical diode, the implanted layer had a room temperature sheet resistivity of 140 ohms per square centimeter, an electron concentration of 3.4 $\times$ 10$^{14}$ cm$^{-2}$, and a mobility of 130 cm$^2$/Vsec.

EXAMPLE VII

Diodes fabricated as described in Example V provided efficient light emitters as depicted schematically in FIG. 9. Efficient electroluminescence was obtained at 77° K from the forward current of the p-n junctions. FIG. 12 shows the electroluminescence spectra obtained with a forward current of 10 mA. The spectrum obtained from a p-n junction prepared by implanting Cd is also shown in FIG. 12 in order to compare the spectral features.

The electroluminescence spectra were dominated by a broad-band emission peaking in the wavelength range of about 1.3 to 1.4$\mu$. However, the peaks of the spectra obtained with p-n junctions prepared even with the same ion were observed to change with different substrates. The difference in the emission peak energy from sample to sample is due to the degree of compensation between donor and acceptor which is controlled by annealing, growth method, and crystal stoichiometry. The photoluminescence experiments indicate that the observed electrouminescence bands in the wavelength range of about 1.3 to 1.4$\mu$ are due to donor-acceptor pair recombination. The difference in the band-peak energy in junctions made with the same ion implantation can be explained by the different Fermi levels which are determined by the degree of compensation between donor and acceptor.

It is noted that spectrum 4 of FIG. 12 shows another emission band peaking at about 1.23$\mu$ which lies at a shorter wavelength than the pair band. This emission is due to Cl donor-to-valence-band transition.

As seen from the foregoing data, the present invention provides an improved method for fabricating p-n and p-i-n junction diodes by ion implantation of Cd, Zn, Br and Cl in p-type CuInSe$_2$ crystals. The Cd, Zn, Br and Cl implanted CuInSe$_2$ p-n junction diodes function as efficient electroluminescent devices in the near IR region. The Cd implanted CuInSe$_2$ p-n and p-i-n junction diodes also function as efficient photovoltaic detectors.

As will be evident to those skilled in the art, modifications of the present invention can be made without departing from the spirit and scope of the invention.

We claim:

1. A method of fabricating a p-n or p-i-n junction device in a p-type CuInSe$_2$ single crystal having a first (112) plane surface and a second (112) plane surface which comprises the steps of:
   a. bombarding the first plane surface with cadmium, zinc, bromine or chlorine ions at an energy of 135 keV to a dose level ranging from about $10^{14}$ to $10^{16}$ per square centimeter, thereby forming an n-type layer in the crystal adjacent the first plane surfacae;
   b. annealing the crystal under a vacuum at a temperature ranging from 300° to 500° C for a period of 10 to 30 minutes;
   c. depositing an indium-tin alloy electrical contact on the first surface; and
   d. depositing a gold electrical contact on the second surface.

2. The method according to claim 1 in which the crystal is annealed under a vacuum at a temperature ranging from 350° to 500° C for a period of 10 to 30 minutes, thereby forming a p-n junction device.

3. The method according to claim 1 in which the crystal is annealed under a vacuum at a temperature ranging from 300° to 350° C, thereby forming a p-i-n junction device.

4. The method according to claim 1 in which the device is an electroluminescent p-n junction diode.

5. The method according to claim 1 in which the device is a photvoltaic effect p-n or p-i-n junction diode and in which the bombarding material is cadmium.

* * * * *